United States Patent
Reade et al.

(10) Patent No.: US 6,809,066 B2
(45) Date of Patent: Oct. 26, 2004

(54) ION TEXTURING METHODS AND ARTICLES

(75) Inventors: Ronald P. Reade, Berkeley, CA (US); Paul H. Berdahl, Walnut Creek, CA (US); Richard E. Russo, Walnut Creek, CA (US); Leslie G. Fritzemeier, Mendon, MA (US)

(73) Assignee: The Regents of the University of California, Oakland, CA (US)

( * ) Notice: Subject to any disclaimer, the term of this patent is extended or adjusted under 35 U.S.C. 154(b) by 106 days.

(21) Appl. No.: 09/918,395

(22) Filed: Jul. 30, 2001

(65) Prior Publication Data

US 2003/0148066 A1 Aug. 7, 2003

(51) Int. Cl.[7] .......................... C23C 14/32; C23C 16/00; H01L 39/24
(52) U.S. Cl. .................. 505/411; 505/320; 505/325; 505/470; 505/473; 505/474; 505/475; 204/192.34; 204/192.35; 204/192.11; 204/298.04; 204/298.36; 156/345.39; 216/66
(58) Field of Search ...................... 204/192.34, 192.35, 204/192.11, 298.04, 298.36; 156/345.39; 505/320, 325, 411, 470, 473, 474, 475; 216/66

(56) References Cited

U.S. PATENT DOCUMENTS

| | | | |
|---|---|---|---|
| 4,776,925 A | 10/1988 | Fossum et al. | 428/297 |
| 5,246,741 A | 9/1993 | Ouhata et al. | 427/524 |
| 5,262,394 A | 11/1993 | Wu et al. | 505/1 |
| 5,372,089 A | 12/1994 | Yoshida et al. | 117/98 |
| 5,432,151 A | 7/1995 | Russo et al. | 505/474 |
| 5,601,654 A | 2/1997 | Springer | 428/694 ML |
| 5,607,781 A | 3/1997 | Okuno et al. | 110/723 HC |
| 5,650,378 A | 7/1997 | Iijima et al. | 505/473 |
| 5,872,080 A | 2/1999 | Arendt et al. | 505/238 |
| 6,033,471 A | 3/2000 | Nakanishi et al. | 117/108 |
| 6,060,375 A | 5/2000 | Owyang et al. | 438/585 |
| 6,190,752 B1 | 2/2001 | Do et al. | 428/141 |
| 6,258,472 B1 | 7/2001 | Neumuller et al. | 428/701 |
| 6,312,819 B1 | 11/2001 | Jia et al. | 428/450 |
| 6,337,991 B1 | 1/2002 | Li et al. | 505/161 |
| 6,498,549 B1 | 12/2002 | Jiang et al. | 333/202 |
| 6,537,689 B2 | 3/2003 | Schoop et al. | 428/701 |
| 2001/0006042 A1 | 7/2001 | Iijima et al. | 118/718 |
| 2002/0017235 A1 | 2/2002 | Nagasaka et al. | 117/106 |
| 2002/0041973 A1 | 4/2002 | Belouet | 428/623 |

FOREIGN PATENT DOCUMENTS

| | | |
|---|---|---|
| JP | 01215966 A | 9/1989 |
| JP | 07-065642 * | 3/1995 |
| WO | 98/58415 | 6/1998 |
| WO | 99/16941 | 9/1998 |
| WO | 99/17307 | 9/1998 |
| WO | 00/58044 | 1/2000 |
| WO | 00/58530 | 3/2000 |
| WO | 01/08169 | 7/2000 |
| WO | 01/08170 | 7/2000 |
| WO | 01/08231 | 7/2000 |
| WO | 01/08232 | 7/2000 |
| WO | 01/08233 | 7/2000 |
| WO | 01/08235 | 7/2000 |
| WO | 01/08236 | 7/2000 |
| WO | 01/11428 | 7/2000 |
| WO | 01/15245 | 7/2000 |
| WO | 01/26164 | 7/2000 |
| WO | 01/26165 | 7/2000 |

OTHER PUBLICATIONS

Mao, Y.J. et al.; "Study on the Growth of Biaxially Aligned Yttria–Stabilized Zirconia Films During Ion Beam Assisted Deposition," Journal of Vacuum Science Technology, vol. A15, No. 5, pp. 2687 thru 2692, Sep./Oct. 1997.

(List continued on next page.)

*Primary Examiner*—Rodney G. McDonald
(74) *Attorney, Agent, or Firm*—John P. O'Banion

(57) ABSTRACT

Ion texturing methods and articles are disclosed.

168 Claims, 3 Drawing Sheets

OTHER PUBLICATIONS

Berdahl, P., et al., "Angular Magnetoresistance Provides Texture Information on High–$T_c$ Conductors", *Physica C*, 195, 1992, pp. 93–102.

Bradley, Mark R., et al., "Theory of Thin–Film Orientation by Ion Bombardment during Deposition", *J. Appl. Phys.* 60 (12), Dec. 15, 1986, pp. 4160–4164.

Dimos, D., et al., "Superconducting Transport Properties of Grain Boundaries in $YBa_2Cu_3O_7$ Bicrystals", *Physical Review B*, vol. 41, No. 7, Mar. 1, 1990, pp. 4038–4049.

Dobrev, D., "Ion–Beam–Induced Texture Formation in Vacuum–Condensed Thin Metal Films", *Thin Solid Films* 92, 1982, pp. 41–53.

Fork, D.K., et al., "High Critical Currents in Strained Epitaxial $YBa_2Cu_3O_{7-\delta}$ on Si", *Appl. Phys. Lett.* 57 (11), Sep. 10, 1990, pp. 1161–1163.

Garrison, S.M., et al., "Observation of Two In–Plane Epitaxial States in $YBa_2Cu_3O_{7-\delta}$ Films on Yttria–Stabilized $ZrO_2$", *Appl. Phys. Lett.* 58 (19), May 13, 1991, pp. 2168–2170.

Iijima, Y., et al., "Biaxially Aligned YSZ Buffer Layer on Polycrystalline Substrates", paper prepared for Proceedings of the Fourth International Symposium on Superconductivity, Tokyo, Japan, Oct. 14–17, 1991, pp. 1–4.

Iijima, Y., et al., "In–Plane Aligned $YBa_2Cu_3O_{7-x}$ Thin Films Deposited on Polycrystalline Metallic Substrates", *Appl. Phys. Lett.* 60 (6), Feb. 10, 1992, pp. 769–771.

Jia, Q.X., et al., "Sputter Deposition of $YBa_2Cu_3O_{7-x}$ Films on Si at 500•C with Conducting Metallic Oxide as a Buffer Layer" *Appl. Phys. Lett.* 57 (3), Jul. 16, 1990, pp. 304–306.

Kumar, Ashok, et al., Synthesis of Superconducting $YBa_2Cu_3O_{7-\delta}$ Thin Films on Nickel–Based Superalloy Using In Situ Pulsed Laser Deposition, *Appl. Phys. Lett.* 57 (24), Dec. 10, 1990, pp. 2594–2596.

Lioutas, Ch.B., et al., "Phase Transformation of Hydrogen Free Amorphous Carbon Films under Ion Beam Bombardment", *Carbon*, vol. 36, No. 5–6, 1998, pp. 545–548.

Mizutani, T., "Compositional and Structural Modifications of Amorphous $SiO_2$ by Low–Energy Ion and Neutral Beam Irradiation", *Journal of Non–Crystalline Solids* 181, 1995, pp. 123–134.

Narumi, E., et al., "Critical Current Density Enhancement in $YBa_2Cu_3O_{6.8}$ Films on Buffered Metallic Substrates", *Appl. Phys. Lett.* 58 (11), Mar. 18, 1991, pp. 1202–1204.

Norton, David P., et al., "High Critical Current Densities in $YBa_2Cu_2O_{7-x}$ Films on Polycrystalline Zirconia", *Appl. Phys. Lett.* 57 (11), Sep. 10, 1990, pp. 1164–1166.

Pangal, K. et al., "Integration of Amorphous and Polycrystalline Silicon Thin–Film Transistors Through Selective Crystallization of Amorphous Silicon", *Appl. Phys. Lett.* 75 (14), Oct. 4, 1999, pp. 2091–2093.

Reade, R.P., et al., Characterization of Y–Ba–Cu–O Thin Films and Yttria–Stabilized Zirconia Intermediate Layers on Metal Alloys Grown by Pulsed Laser Deposition, *Appl. Phys. Lett.* 59 (6), Aug. 5, 1991, pp. 739–741.

Reade, R.P., et al., "Laser Deposition of Biaxially Textured Yttria–Stabilized Zirconia Buffer Layers on Polycrystalline Metallic Alloys for High Critical Current Y–Ba–Cu–O Thin Films", *Appl. Phys. Lett.* 61 (18), Nov. 2, 1992, pp. 2231–2233.

Russo, R.E., et al., "Fabrication and Characterization of Y–Ba–Cu–O Thin–Films on Stainless–Steel Substrates", submitted by authors for publi–cation in *High Temperature Superconducting Compounds II*, edited by S.H. Whang (Minerals, Metals, and Materials Society, Warrendale), 1990, pp. 1–6.

Russo, R.E., et al., "Metal Buffer Layers and Y–Ba–Cu–O Thin–Films on Pt and Stainless–Steel Using Pulsed Laser Deposition", *J. Appl. Phys.* 68 (3), Aug. 1, 1990, pp. 1354–1356.

Tiwari, P., et al., "In Situ Single Chamber Laser Processing of $YBa_2Cu_3O_{7-\delta}$ Superconducting Thin Films on Si (100) with Yttria–Stabilized Zirconia Buffer Layers", *Appl. Phys. Lett.* 57 (15), Oct. 8, 1990, pp. 1578–1580.

Van Wyk, G.N., "The Dependence of Ion Bombardment Induced Preferential Orientation on the Direction of the Ion Beam", *Radiation Effects Letters*, vol. 57, 1980, pp. 45–50.

Van Wyk, G.N., et al., "Ion Bombardment Induced Preferential Orientation in Polycrystalline Cu Targets", *Radiation Effects*, vol. 38, 1978, pp. 245–247.

Wang, C.P. et al., "Deposition of In–Plane Textured MgO on Amorphous $Si_3N_4$ Substrates on Ion–Beam–Assisted Deposition and Comparisons with Ion–Beam–Assisted Deposited Yttria–Stabilized–Zirconia", *Appl. Phys. Lett.* 71 (20), Nov. 17, 1997, pp. 2955–2957.

Wiesmann, J., et al., "Large–Area Deposition of Biaxially Textured YSZ Buffer Layers Using an IBAD–Process", *Nucl. Instr. and Meth. in Phys. Res. B* 120, 1996, pp. 290–292.

* cited by examiner

ION TEXTURING METHODS AND ARTICLES

INCORPORATION BY REFERENCE

The following documents are hereby incorporated by reference: U.S. Pat. No. 5,231,074, issued on Jul. 27, 1993, and entitled "Preparation of Highly Textured Oxide Superconducting Films from MOD Precursor Solutions," U.S. Pat. No. 6,022,832, issued Feb. 8, 2000, and entitled "Low Vacuum Process for Producing Superconductor Articles with Epitaxial Layers," U.S. Pat. No. 6,027,564, issued Feb. 22, 2000, and entitled "Low Vacuum Process for Producing Epitaxial Layers," U.S. Pat. No. 6,190,752, issued Feb. 20, 2001, and entitled "Thin Films Having Rock-Salt-Like Structure Deposited on Amorphous Surfaces,' PCT Publication No. WO 00/58530, published on Oct. 5, 2000, and entitled "Alloy Materials," PCT Publication No. WO/58044, published on Oct. 5, 2000, and entitled "Alloy Materials," PCT Publication No. WO 99/17307, published on Apr. 8, 1999, and entitled "Substrates with Improved Oxidation Resistance," PCT Publication No. WO 99/16941, published on Apr. 8, 1999, and entitled "Substrates for Superconductors," PCT Publication No. WO 98/58415, published on Dec. 23, 1998, and entitled "Controlled Conversion of Metal Oxyfluorides into Superconducting Oxides," PCT Publication No. WO 01/11428, published on Feb. 15, 2001, and entitled "Multi-Layer Articles and Methods of Making Same," PCT Publication No. WO 01/08232, published on Feb. 1, 2001, and entitled "Multi-Layer Articles And Methods Of Making Same," PCT Publication No. WO 01/08235, published on Feb. 1, 2001, and entitled "Methods And Compositions For Making A Multi-Layer Article," PCT Publication No. WO 01/08236, published on Feb. 1, 2001, and entitled "Coated Conductor Thick Film Precursor", PCT Publication No. WO 01/08169, published on Feb. 1, 2001, and entitled "Coated Conductors With Reduced A.C. Loss" PCT Publication No. WO 01/15245, published on Mar. 1, 2001, and entitled "Surface Control Alloy Substrates And Methods Of Manufacture Therefor," PCT Publication No. WO 01/08170, published on Feb. 1, 2001, and entitled "Enhanced Purity Oxide Layer Formation," PCT Publication No. WO 01/26164, published on Apr. 12, 2001, and entitled "Control of Oxide Layer Reaction Rates," PCT Publication No. WO 01/26165, published on Apr. 12, 2001, and entitled "Oxide Layer Method," PCT Publication No. WO 01/08233, published on Feb. 1, 2001, and entitled "Enhanced High Temperature Coated Superconductors," PCT Publication No. WO 01/08231, published on Feb. 1, 2001, and entitled "Methods of Making A Superconductor," U.S. patent application Ser. No. 09/579,193, filed on May 26, 2000, and entitled, "Oxide Bronze Compositions And Textured Articles Manufactured In Accordance Therewith," U.S. patent application Ser. No. 09/694,400, filed on Oct. 23, 2000, and entitled "Precursor Solutions and Methods of Using Same," and U.S. patent application Ser. No. 09/855, 312, filed on May 14, 2001, and entitled "Precursor Solutions and Methods of Using Same."

This invention was made under a CRADA (CRADA No. BG-00-441) between American Superconductor Corporation and Lawrence Berkeley National Laboratory operated for the United States Department of Energy. The United States Government has certain rights in this invention.

TECHNICAL FIELD

The invention relates to ion texturing methods and articles.

BACKGROUND

Multi-layer articles can be used in a variety of applications. For example, superconductors, including oxide superconductors, can be formed of multi-layer articles. Typically, such superconductors include a layer of superconductor material and a layer, commonly referred to as a substrate, that can enhance the mechanical strength of the multi-layer article.

Generally, in addition to enhancing the strength of the multi-layer superconductor, the substrate should exhibit certain other properties. For example, the substrate should have a low Curie temperature so that the substrate is not ferromagnetic at the superconductor's application temperature. Furthermore, chemical species within the substrate should not be able to diffuse into the layer of superconductor material, and the coefficient of thermal expansion of the substrate should be about the same as the superconductor material. Moreover, if the substrate is used for an oxide superconductor, the substrate material should be relatively resistant to oxidation.

For some materials, such as yttrium-barium-copper-oxide (YBCO), the ability of the material to provide high transport current in its superconducting state depends upon the crystallographic orientation of the material. For example, such a material can exhibit a relatively high critical current density (Jc) when the surface of the material is biaxially textured.

As used herein, "biaxially textured" refers to a surface for which the crystal grains are in close alignment with a direction in the plane of the surface or in close alignment with both a direction in the plane of the surface and a direction perpendicular to the surface. One type of biaxially textured surface is a cube textured surface, in which the primary cubic axes of the crystal grains are in close alignment with a direction perpendicular to the surface and with the direction in the plane of the surface. Examples of cube textured surfaces include the (100)[001] and (100)[011] surfaces, and an example of a biaxially textured surface is the (113)[211] surface.

For certain multi-layer superconductors, the layer of superconductor material is an epitaxial layer. As used herein, "epitaxial layer" refers to a layer of material whose crystallographic orientation is derived from the crystallographic orientation of the surface of a layer of material onto which the epitaxial layer is deposited. For example, for a multi-layer superconductor having an epitaxial layer of superconductor material deposited onto a substrate, the crystallographic orientation of the layer of superconductor material is derived from the crystallographic orientation of the substrate. Thus, in addition to the above discussed properties of a substrate, it can be also desirable for a substrate to have a biaxially textured surface or a cube textured surface.

Some substrates do not readily exhibit all the above-noted features, so one or more intermediate layers, commonly referred to as buffer layers, can be disposed between the substrate and the superconductor layer. The buffer layer(s) can be more resistant to oxidation than the substrate, and reduce the diffusion of chemical species between the substrate and the superconductor layer. Moreover, the buffer layer(s) can have a coefficient of thermal expansion that is well matched with the superconductor material.

In some instance, a buffer layer is an epitaxial layer, so its crystallographic orientation is derived from the crystallographic orientation of the surface onto which the buffer layer is deposited. For example, in a multi-layer superconductor having a substrate, an epitaxial buffer layer and an epitaxial layer of superconductor material, the crystallographic orientation of the surface of the buffer layer is derived from the crystallographic orientation of the surface of the substrate, and the crystallographic orientation of the layer of superconductor material is derived from the crystallographic orientation of the surface of the buffer layer. Therefore, the superconducting properties exhibited by a multi-layer superconductor having a buffer layer can depend upon the crystallographic orientation of the buffer layer surface.

In certain instances, a buffer layer is not an epitaxial layer but can be formed using ion beam assisted deposition. Typically, ion beam assisted deposition involves exposing a surface to ions directed at a specific angle relative to the surface while simultaneously depositing a material. In instances where ion beam assisted deposition is used to form a buffer layer, the crystallographic orientation of the surface of the buffer layer can be unrelated to the crystallographic orientation of the surface of the underlying layer (e.g., a substrate). Generally, however, the ion beam deposition parameters such as, for example, the ion energy and beam current, the temperature, the ratio of the number of atoms arriving at the surface relative to the number of ions coincidentally arriving at the surface, and the angle of incidence on the surface are selected so that the crystallographic orientation of the surface of the buffer layer provides an appropriate template for a layer that is deposited on the surface of the buffer layer (e.g., a layer of superconducting material).

SUMMARY

The invention generally relates to ion texturing methods and articles.

In part, the invention relates to the realization that, by selecting the appropriate combination of parameters, multiple ion beams (e.g., two, three, four, etc.) can be used to increase the degree of texture of the surface (e.g, a noncrystalline surface) of a layer of material (e.g., a layer of an already deposited material, such as an already deposited buffer layer) so that the surface of the material has a predetermined crystallographic orientation. The crystallographic orientation of the ion textured surface can be different than the natural growth orientation of the layer of material.

The surface to be textured can be, for example, that of a substrate, a buffer layer, a protective layer or a layer of superconductor material. In certain embodiments, a multi-layer article (e.g., a multi-layer superconductor article, such as a coated superconductor article) can include more than one layer having an ion textured (or at least partially ion textured surface).

Materials that can be ion textured include, for example, metals, alloys, oxides of metals, nitrides of metals, oxides of alloys and nitrides of alloys. Such materials include, for example, nickel, nickel alloys, silver, MgO, titanium nitride, zirconia, zirconium nitride, $TbO_x$, $GaO_x$, ceria ($CeO_2$), yttria stabilized zirconia (YSZ), $Y_2O_3$, $LaAlO_3$, $SrTiO_3$, $Gd_2O_3$, $LaNiO_3$, $LaCuO_3$, $SrRuO_3$, $NdGaO_3$, ruthenium oxide, barium titanate, lanthanum gallate, indium oxide and $NdAlO_3$.

In some embodiments, the combination of appropriate parameters (e.g., the angle of the ion beams relative to the surface normal, the angle of the ion guns relative to each other and/or the crystal structure of the layer of material exposed to the ion beams) can be used to provide the predetermined crystallographic orientation of the surface in a relatively short period of time.

The multiple ion beams can be simultaneously active, or the multiple ion beams can be used in sequence. In some embodimnents, some or all of the ion beams can be simultaneously active for a portion of the ion bombardment, and some or all of the ion beams can be used sequentially for a portion of the ion bombardment.

In some embodiments, the multiple ion beams can provide an ion flux sufficiently high so that the sputtering rate of the noncrystalline surface would exceed the atom arrival rate during certain vapor deposition processes.

In certain embodiments, the process can provide a noncrystalline substrate having an ion textured surface.

In some embodiments, the process can provide a substrate with a noncrystalline layer deposited thereon. The surface of the noncrystalline layer can be ion textured.

In certain embodiments, the process can provide a substrate with one or more buffer layers (crystalline or noncrystalline, and/or epitaxial or nonepitaxial) with a layer (e.g., a thin protective layer) deposited thereon. The surface of the layer (e.g., protective layer) can be ion textured. The layer can act as a protective layer for one or more (e.g., all) of the underlying layers. The layer can be chemically compatible with a superconductor material or a precursor thereof (e.g., chemically compatible with a halogen-containing precursor of YBCO, such as a fluoride-containing precursor, including one or more $BaF_2$-containing precursors).

In one aspect, the invention features a method of ion texturing a noncrystalline surface of a layer of a cubic structure material. The method includes exposing the noncrystalline surface to at least two ion beams to texture the noncrystalline surface and form a biaxially textured surface of the cubic structure material. The at least two ion beams impinge on the surface of the noncrystalline layer at a first angle relative to a perpendicular to the noncrystalline surface, the at least two ion beams being disposed relative to each other at a second angle around the perpendicular to the noncrystalline surface. The second angle is about 90° and so that a crystal plane of the biaxially textured surface is oriented perpendicular to the biaxially textured surface.

The cubic structure material can be YSZ, and the first angle can be from about 51° to about 59° (e.g., about 55°).

The cubic structure material can be YSZ, and the YSZ can be at a temperature of from about room temperature to about 900° C. during ion texturing.

The cubic structure material can be, for example, a rock-salt structure material or a fluorite structure material.

The cubic structure material can be, for example, MgO, TiN, CaO, SrO, ZrO, BaO, YSZ or ceria.

The second angle can be about 180°.

The second angle can be about 90°.

The method can further include disposing a layer of a second material on the biaxially textured surface of the cubic structure material. The second material can be, for example, a superconductor material, a precursor of a superconductor material, a material that is chemically compatible with a superconductor material, or a material that is chemically compatible with a precursor of a superconductor material.

The second material can be chemically compatible with $BaF_2$.

The second material can be, for example, ceria, $LaAlO_3$ or $SrTiO_3$.

The second material can be, for example, YBCO or a precursor of YBCO.

The biaxially textured surface of the cubic structure material can be cube textured.

The method can further include, before exposing the noncrystalline surface to the at least two ion beams, forming the layer of the cubic structure material having the noncrystalline surface by simultaneously depositing the cubic material and exposing the cubic material to at least one ion beam.

The method can further include, after forming the biaxially textured surface, simultaneously depositing more of the cubic material on the biaxially textured surface and exposing the cubic material to at least one ion beam.

The at least two ion beams can simultaneously impinge on the noncrystalline surface.

The at least two ion beams can impinge on the noncrystalline surface in sequence.

The at least two ion beams can be, for example, two ion beams, three ion beams or four ion beams.

In another aspect, the invention features a method of ion texturing a noncrystalline surface of a layer of a material. The method includes exposing the noncrystalline surface to at least two ion beams to texture the noncrystalline surface and form a textured surface of the material. The first ion beam of the at least two ion beams impinges on the surface at a first angle relative to the perpendicular to the noncrystalline surface. The second ion beam of the at least two ion beams impinges on the surface of the noncrystalline layer at a second angle relative to a perpendicular to the noncrystalline surface. The at least two ion beams are disposed relative to each other at a third angle so that a crystal plane of the biaxially textured surface is oriented perpendicular to the biaxially textured surface.

The at least two ion beams can be, for example, two ion beams, three ion beams or four ion beams.

The at least two ion beams can simultaneously impinge on the noncrystalline surface.

The at least two ion beams can impinge on the noncrystalline surface in sequence.

The method can further include, before exposing the noncrystalline surface to the at least two ion beams, forming the layer of the material having the noncrystalline surface by simultaneously depositing the material and exposing the material to at least one ion beam.

The method can further include, after forming the biaxially textured surface, simultaneously depositing more of the material on the textured surface and exposing the material to at least one ion beam.

The method can further include disposing a layer of a second material on the textured surface of the material. The second material can be, for example, a superconductor material, a precursor of a superconductor material, a material that is chemically compatible with a superconductor material, and a material that is chemically compatible with a precursor of a superconductor material.

The second material can be chemically compatible with $BaF_2$.

The second material can be, for example, ceria, $LaAlO_3$ or $SrTiO_3$.

The second material can be, for example, YBCO or a precursor of YBCO.

The material can be at an exposure temperature during exposure to the at least two ion beams with the exposure temperature being less than a crystallization temperature of the material.

The textured surface can be biaxially textured.

The textured surface can be cube textured.

The material can be, for example, a cubic structure material or a hexagonal structure material.

The material can be a rock salt structure material or a fluorite structure material.

The ion flux at the surface of the material can be at least about 10 microAmperes per square centimeter.

The crystal plane can be the (001) plane.

The method can texture the material to a depth of less than about 50 nanometers.

The textured surface can have a X-ray phi scan full width at half maximum of less than about 20°.

The textured surface can have a root mean square roughness of less than about 100 angstroms.

The noncrystalline layer can be supported by a substrate. The substrate can be a nontextured substrate.

The method can be performed in a pressure of less than about 10 millitorr.

The exposure to the ions can occur for a time period of at least about 10 seconds.

The method can further include, after an initial ion exposure, decreasing the temperature while exposing the surface to ions.

The first angle can be different than the second angle.

In a further aspect, the invention features a method that includes exposing a surface of a noncrystalline layer of a first material to at least two ion beams to texture the noncrystalline surface and to form a textured surface of the first material. The method also includes disposing a layer of a second material on the textured surface of the first material. The second material is chemically compatible with a third material. The third material is a superconductor or a precursor of a superconductor.

The third material can be, for example, a rare earth metal oxide superconductor or a precursor of a rare earth metal oxide superconductor.

The third material can be, for example, YBCO or a precursor of YBCO.

The third material can be an acid (e.g., a halogenated acetic acid, such as trifluoroacetic acid).

The third material can contain $BaF_2$.

The method can form a superconductor article having a critical current density of at least about $5 \times 10^5$ Amperes per square centimeter.

The second material can be, for example, ceria, $LaAlO_3$ or $SrTiO_3$.

The first material can be, for example, YSZ or a nitride.

The method can further include disposing the third material on a surface of the second material.

In one aspect, the invention features a method that includes disposing a noncrystalline layer of a second material on a surface of a first material. The second material is chemically compatible with a third material selected from the group consisting of superconductors and precursors of superconductors. The method also includes exposing a surface of the noncrystalline layer of the second material to at least two ion beams to texture the noncrystalline surface and to form a textured surface of the second material.

The third material can be, for example, a rare earth metal oxide superconductor or a precursor of a rare earth metal oxide superconductor.

The third material can contain, for example, YBCO or a precursor of YBCO.

The third material can be an acid (e.g., a halogenated acetic acid).

The can form a superconductor article having a critical current density of at least about $5 \times 10^5$ Amperes per square centimeter.

The layer of the first material can be noncrystalline.

The second material can be, for example, ceria, $LaAlO_3$ or $SrTiO_3$.

The first material can be, for example, YSZ or a nitride.

In anther aspect, the invention features an article that includes a substrate having a surface with a root mean square roughness of at least about 100 nanometers. The article also includes a layer of a first material supported by the surface of the substrate. The layer of the first material has a textured surface. The article further includes an epitaxial layer of a second material supported by the textured surface of the layer of the first material.

The first material can be an amorphous material.

The first material can be disposed on the surface of the substrate.

The first material can be a buffer layer material.

The epitaxial layer can be disposed on the textured surface of the layer of the first material.

The second material can be a buffer layer material.

The second material can be, for example, a superconductor material or a precursor of a superconductor material.

The article can have a critical current density of at least about $5 \times 10^5$ Amperes per square centimeter.

The second material can be, for example, YBCO or a precursor of YBCO.

In a further aspect, the invention features an article that includes a substrate having a surface with a root mean square roughness of at least about 100 nanometers. The article also includes a layer of a superconductor material supported by the surface of the substrate. The article has a critical current density of at least about $5 \times 10^5$ Amperes per square centimeter.

The article can have a critical current density of at least about $1 \times 10^6$ Amperes per square centimeter.

The layer of the superconductor material can be biaxially textured.

The layer of the superconductor material can be c-axis out of plane and biaxially textured in plane.

The article can further include a layer of a second material disposed between the substrate and the layer of superconductor material.

The the layer of the second material can have a textured surface that supports the layer of the superconductor material.

The layer of the superconductor material can be disposed on the textured surface of the layer of the second material.

The second material can be a buffer layer material.

The second material can be chemically compatible with the superconductor material.

The article can further include a layer of a third material disposed between the layer of the second material and the layer of the superconductor material. The layer of the third material can be chemically compatible with the superconductor material.

In one aspect, the invention features a system that includes a first ion beam source capable of emitting a first ion beam and a second ion beam source capable of emitting a second ion beam. The first and second ion beam sources are positioned so that when they emit the first and second ion beams, respectively, to impinge on a surface to texture the surface, the first ion beam is disposed at a first angle relative to a perpendicular to the surface and the second ion beam is disposed at a second angle relative to the perpendicular to the surface. The first and second ion beams are also disposed relative to each other at a third angle so that a crystal plane of the textured surface is oriented perpendicular to the textured surface.

The first angle can be different than the second angle.

The system can further include a third ion beam source capable of emitting a third ion beam. The third ion beam source can be positioned so that it emits the third ion beam to impinge on the surface to texture the surface. The third ion beam can be disposed at a fourth angle relative to the perpendicular to the surface, and the first and third ion beams are disposed relative to each other at a fifth angle so that a crystal plane of the textured surface is oriented perpendicular to the textured surface.

The system can further include a fourth ion beam source capable of emitting a fourth ion beam. The fourth ion beam source can be positioned so that it emits the fourth ion beam to impinge on the surface to texture the surface. The fourth ion beam can be disposed at a sixth angle relative to the perpendicular to the surface, and the fourth and third ion beams are disposed relative to each other at an angle so that a crystal plane of the textured surface is oriented perpendicular to the textured surface.

The invention can provide superconductor articles having a relatively high critical current density (e.g., coated superconductor articles having a relatively high critical current density, such as a coated conductor having a layer of superconductor material with biaxial texture in plane or a superconductor material with c-axis out of plane and biaxial texture in plane) without using a textured substrate (e.g., by using a noncrystalline substrate, such as a substrate having an amorphous surface or a polycrystalline surface).

The invention can provide superconductor articles having a relatively high critical current density (e.g., coated superconductor articles having a relatively high critical current density) without epitaxially growing a layer on the surface of a substrate.

The invention can provide superconductor articles having a relatively high critical current density (e.g., coated superconductor articles having a relatively high critical current density) with relatively few epitaxially grown layers (e.g., with only the layer of superconductor material being epitaxially grown).

The invention can provide relatively fast methods of growing a textured layer of material (e.g., a textured buffer layer of a superconductor article, such as a coated superconductor article).

The invention can provide methods of preparing a textured (e.g., highly textured) layer of material (e.g., a buffer layer of a superconductor article, such as a coated superconductor article) without growing the layer of material epitaxially.

The invention can provide methods of exposing a layer of material (e.g., a noncrystalline material, such as an amorphous material or a polycrystalline material) to ions to texture (e.g., highly texture) the material (e.g., to texture at least a region of the material adjacent a surface of the material exposed to ion texturing).

The invention can provide methods of preparing a superconductor article (e.g., a superconductor article having a relatively high critical current density), such as a coated superconductor article, in which a relatively stable layer (e.g., a layer of ceria ($CeO_2$)) is used so that subsequent layer(s) (e.g., a layer of a superconductor material) can be incorporated (e.g., disposed) under different environmental conditions and/or after a relatively long period of time following formation of the layer (e.g., a buffer layer, such as a buffer layer having an ion textured surface) underlying the relatively stable layer.

The invention can provide methods of preparing a superconductor article (e.g., a superconductor article having a relatively high critical current density), such as a coated superconductor article, in which a layer of a superconductor material (e.g., YBCO) is disposed on a layer of a material (e.g., a layer of ceria) that is chemically compatible with the superconductor material and/or one or more precursor(s) of the superconductor material (e.g., a barium-containing precursor, such as a precursor containing $BaF_2$). Generally, the layer of the chemically compatible material has a textured surface on which the layer of the superconductor material is disposed. The layer of chemically compatible material can be, for example, epitaxially grown, grown by ion beam assisted deposition, or prepared using ion texturing. Combinations of these methods can be used.

The invention can provide methods of ion texturing a layer (e.g., a layer of a superconductor article, such as a coated superconductor article) without concern for the ion to atom ratio used during ion bombardment.

The invention can provide methods of ion texturing relatively rough surfaces because the use of multiple ion beams can overcome shadowing effects.

The invention can provide methods of ion texturing that can overcome the natural growth orientation of the material of interest (i.e., the growth orientation of the material of interest in the absence of multiple ion beams). This can allow for the predetermined selection of the crystal plane that is oriented parallel to the ion textured surface.

The use of multiple (e.g., two, three, four, etc.) ion beams can reduce certain undesirable effects associated with ion beam divergence. In some embodiments, this can result in improved surface quality.

Features, objects and advantages of the invention are in the description, drawings and claims.

DETAILED DESCRIPTION

Figure 1:
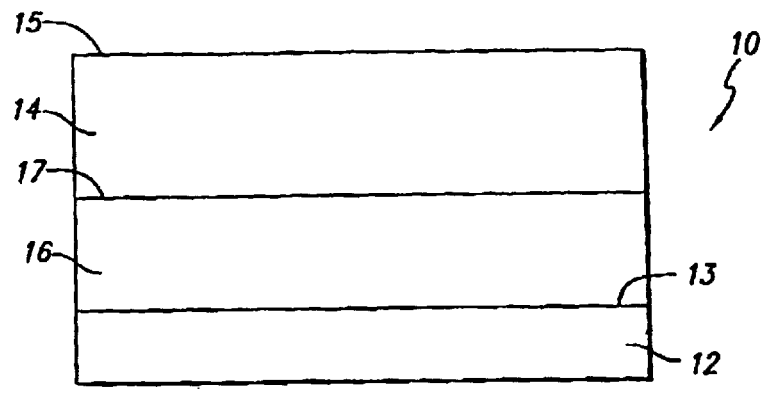
FIG. 1 is a cross-sectional view of an embodiment of a multi-layer article.

FIG. 1 shows a multi-layer article 10 (e.g., a superconductor article) including a layer 12 (e.g., a substrate) with a surface 13, a layer 16 (e.g., a buffer layer) with an ion textured surface 17, and a layer 14 (e.g., a layer of a superconductor material) with a surface 15. Layer 16 is disposed on surface 13, and layer 14 is disposed on ion textured surface 17.

Generally, prior to ion texturing, the surface of layer 16 is a noncrystalline form (e.g., an amorphous form or a nanocrystalline form). This noncrystalline surface is exposed to at least two ion beams to at least partially texture (e.g., fully texture) the surface, thereby forming ion textured surface 17 that has a predetermined orientation both in the plane of surface 17 and out of the plane of surface 17. In certain embodiments, the surface of layer 16 can be partially textured prior to ion texturing, and ion texturing can be used to achieve ion textured surface 17.

A noncrystalline (e.g., amorphous or nano-crystalline) surface generally exhibits no clear or distinct diffraction peaks in a conventional x-ray $\theta$–$2\theta$ scan. Typically, the signal in a conventional x-ray $\theta$–$2\theta$ scan of a noncrystalline surface is less than about 10% of the corresponding signal in a conventional x-ray $\theta$–$2\theta$ scan of a crystalline surface when the signal is measured at a point in the respective x-ray $\theta$–$2\theta$ scans corresponding to a characteristic peak for the crystalline surface.

Ion textured surface 17 can be, for example, biaxially textured (e.g., cube textured) with the (111), (001) or (110) planes oriented perpendicular to the surface 17, and surface 17 can have a specific crystalline direction (e.g., (100)) oriented in the plane with respect to the ion beams.

Figure 2A:
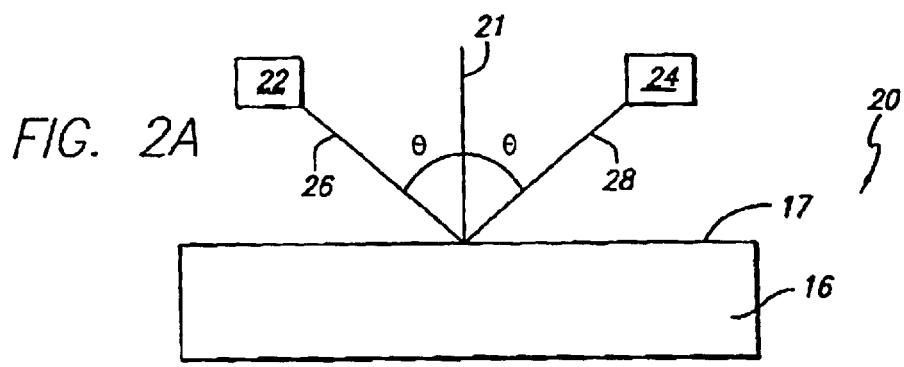
FIG. 2A is a side view of an embodiment of a system having two ion beam sources.
Figure 2B:
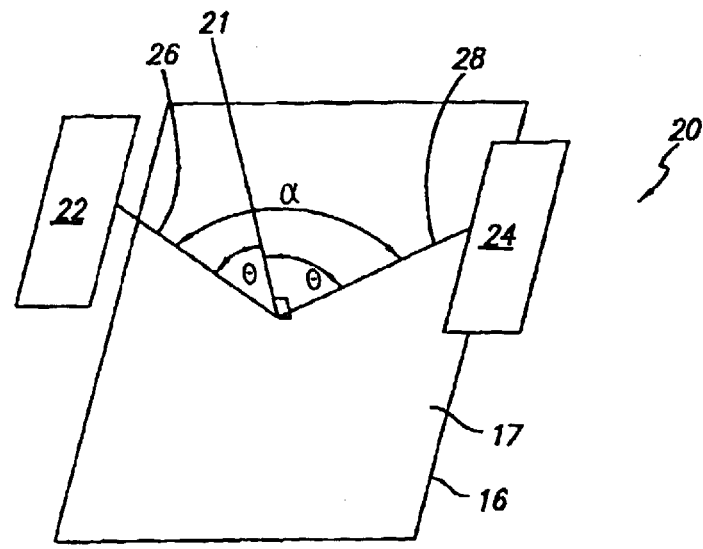
FIG. 2B is a perspective view of an embodiment of a system having two ion beam sources.

FIGS. 2A and 2B show a side view and a perspective view, respectively, of an embodiment of an ion texture system 20 for ion texturing surface 17. System 20 includes two ion beam sources (e.g., ion beam guns, such as three centimeter Commonwealth Scientific ion guns) 22 and 24 that direct ion beams 26 and 28, respectively, at surface 17. Ion beams 26 and 28 are directed at surface 17 at an angle $\theta$ relative to a perpendicular 21 of surface 17. Ion beams 26 and 28 are also directed with respect to each other at an angle $\alpha$.

Without wishing to be bound by theory, it is believed that multiple ion beams can operate together to ion texture a noncrystalline surface, resulting in a surface with an improved level of in-plane and out-of-plane orientation control. It is believed that, using only one ion beam, only one crystallographic direction is preferred to align with the ion beam, and the crystal can be oriented in random rotational aspects relative to this direction. It is also believed that a second ion beam can be used to reinforce the crystallization process, provided that: 1.) the ion beams are at appropriate angle $\theta$ relative to the perpendicular of the noncrystalline surface, 2.) the ion beams are at an appropriate angle $\alpha$ relative to each other. It is further believed that additional ion beams (e.g., a third ion beam, a fourth ion beam, etc.) located at an appropriate angle a relative to the other ion beams can additionally enhance the in-plane and out-of-plane alignment of the ion textured surface.

The angle $\alpha$ is generally determined by the crystal structure of the material of layer 16 and the desired orientation of surface 17 subsequent to ion texturing, and the angle α is typically chosen so that each of ion beams 26 and 28 is aligned along the same equivalent crystallographic direction.

For example, materials with cubic structures (e.g., a rock salt structure material such as MgO, TiN, CaO, SrO, ZrO or BaO, or a fluorite structure material, such as yttria stabilized zirconia (YSZ) or ceria) exhibit four fold symmetry so that each crystalline direction is repeated four times within the crystal unit. The angle α between two equivalent crystallographic directions is readily determined by standard geometrical calculations and/or tables of interplanar angles. Information regarding appropriate values for α is disclosed, for example, in J. W. Edington, Practical Electron Microscopy in Materials Science, Van Nostrand Rheinhold Company, 1976, which is hereby incorporated by reference.

As another example, materials with hexagonal structures (e.g., titanium, yttrium, zirconium, $BaTiO_3$, $TiB_2$) exhibit 6-fold symmetry so that each crystalline direction is repeated six times within the crystal unit. The angle α is determined for hexagonal materials in a manner similar to that described for cubic materials.

The angle θ is generally selected so that each of ion beams 26 and 28 is maintained along a specific crystallographic orientation and so that ion texturing produces the desired texture (e.g., biaxial texture or cube texture) in surface 17. Each of ion beams 26 and 28 can be at a different angle θ with respect to the perpendicular of surface 17. Alternatively, each of ion beams 26 and 28 can be at the same angle θ with respect to the perpendicular of surface 17.

For example, in embodiments in which layer 16 is formed of YSZ and in which a cube textured surface is desired, the angle θ would be about 54.7° to conform with crystallographic requirements. Those skilled in the art will recognize that in practical applications this angle can be from about 51° to about 59° (e.g., from about 53° to about 57°, about 55°, 54.7°). As another example, in embodiments in which layer 16 is formed of ceria or MgO, θ can similarly be from about 40° to about 50° (e.g., from about 43° to about 47°, about 45°).

While certain values for θ and a have been disclosed, other values will be apparent to those skilled in the art. For example, values for θ and/or α can be determined from information available from ion beam assisted deposition studies and from available crystal structure information, such as disclosed, for example, in J. W. Edington, Practical Electron Microscopy in Materials Science, Van Nostrand Rheinhold Company, 1976.

The appropriate parameters for ion texturing have been generally discussed above with particular reference to an ion texture system containing two ion guns. It is to be understood, however, that the general principles for appropriate parameter selection for ion texturing a noncrystalline surface which are discussed above can be applied to ion texture systems containing more than two ion guns.

Figure 3A:
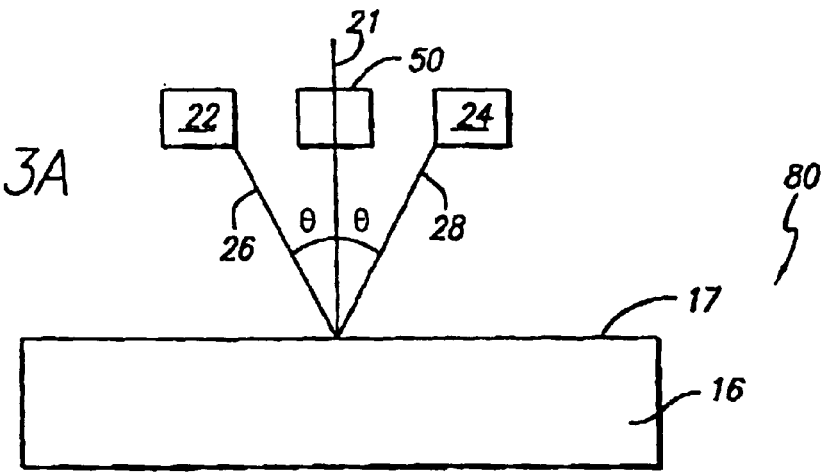
FIG. 3A is a side view of an embodiment of a system having three ion beam sources.
Figure 3B:
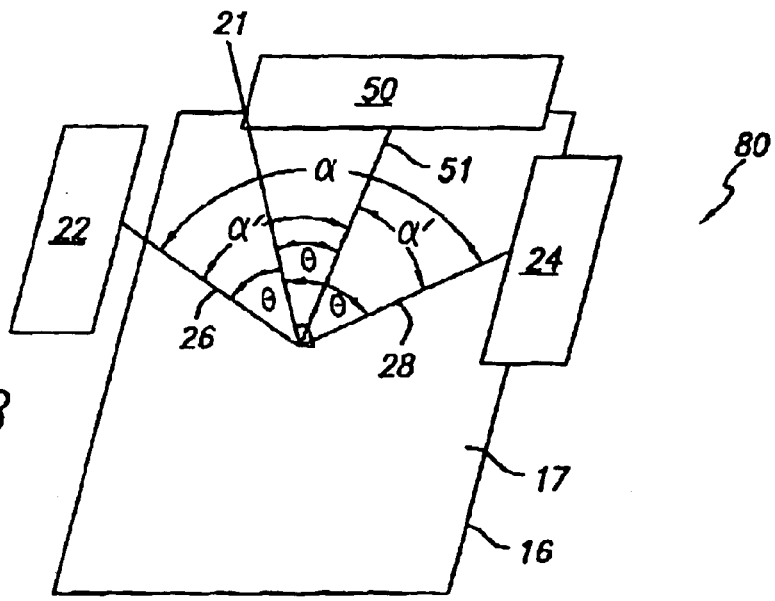
FIG. 3B is a perspective view of an embodiment of a system having three ion beam sources.

For example, FIGS. 3A and 3B show a side view and a perspective view, respectively, of an ion texture system 80 containing ion guns 22, 24 and 50 having ion beams 26, 28 and 51, respectively. Ion gun 50 is configured at an angle α' relative to ion guns 22 and 24, and ion guns 22 and 24 are configured at an angle α relative to each other. Angles α and α' correspond to the angles between equivalent crystallographic directions in the crystal of interest. Each of ion beams 26, 28 and 52 are configured at angle θ with respect to perpendicular 21.

Figure 4A:
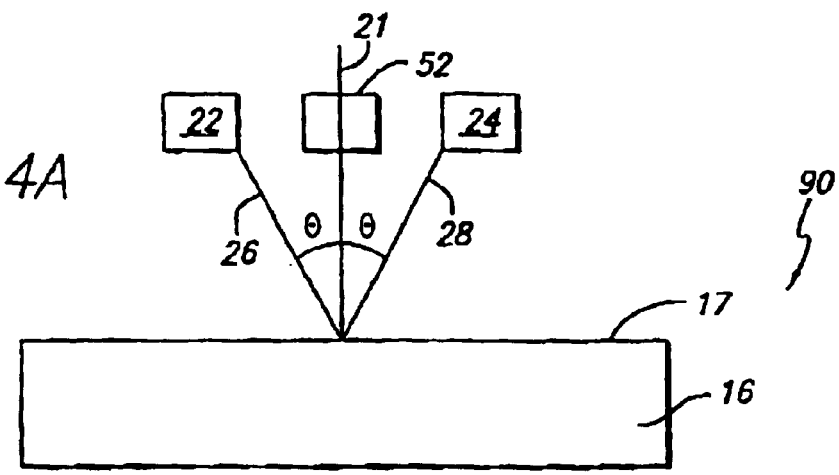
FIG. 4A is a side view of an embodiment of a system having four ion beam sources.
Figure 4B:
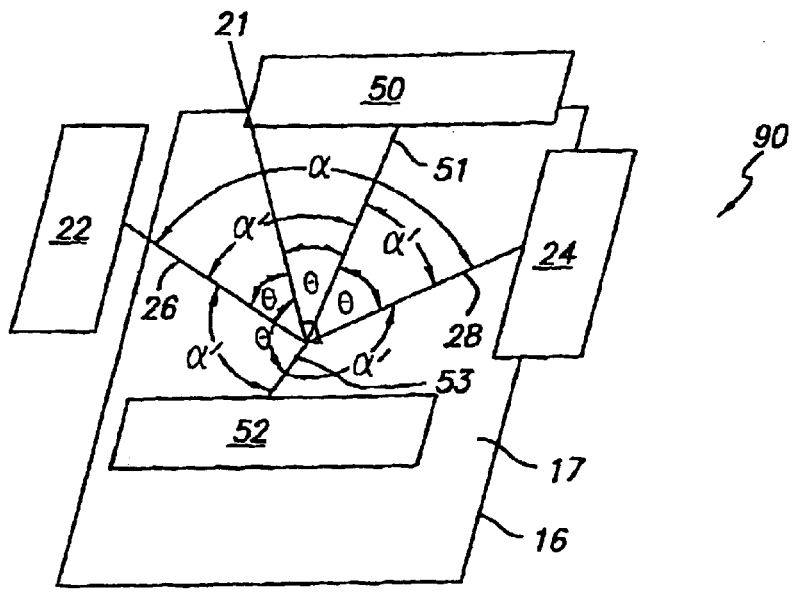
FIG. 4B is a perspective view of an embodiment of a system having four ion beam sources.

As another example, FIGS. 4A and 4B show a side view and a perspective view, respectively, of an ion texture system 90 containing ion guns 22, 24, 50 and 52 having ion beams 26, 28, 51 and 53, respectively. Each of ion guns 50 and 52 is configured at an angle α' relative to ion guns 22 and 24, and ion guns 22 and 24 are configured at an angle α relative to each other. Angles α and α' correspond to the angles between equivalent crystallographic directions in the crystal of interest. Each of ion beams 26, 28, 50 and 52 are configured at angle θ with respect to perpendicular 21.

It is to be understood that, while the foregoing description has involved simultaneous use of ion guns, multiple ion guns need not be used simultaneously to ion texture a noncrystalline surface. For example, multiple ion guns may be used in sequence. As another example, multiple ion guns may be used simultaneously for a portion of the ion texturing process, and in sequence in another part of the ion texturing process. As a further example, certain ion guns may be used simultaneously during ion texturing, while other ion guns are used in sequence.

It is also to be understood that ion texturing can be used in combination with ion beam assisted deposition. For example, a layer can be formed using ion beam assisted deposition, and subsequently textured using ion texturing. This can be desirable, for example, when ion beam assisted deposition can be used to deposit the material relatively quickly (e.g., when growing certain oxides and/or certain nitrides). Alternatively or additionally, a surface can be partially (or even fully) textured using ion texturing, followed by ion beam assisted deposition (e.g., to complete formation of the layer of material with the surface of the completed layer having, for example, a fully textured surface or a partially textured surface). This can be desirable, for example, to enhance the texture of the material. Combining a step of ion texturing followed by ion beam assisted deposition can reduce the ion beam assisted deposition time for achieving a particular material layer having a desired amount of surface texture.

It is to be further understood that, while the figures show certain directions of the ion beams relative to each other directions can be chosen based upon the crystallography of the material to be ion textured and based upon the desired biaxial surface texture to be achieved. The technique can be generalized to provide a surface texture which supports the desired functionality of the article.

In general, ion texturing can be performed under any temperature that results in the desired surface texture (e.g., the desired in-plane and out-of-plane alignment). Typically, when ion texturing surface 17, layer 16 is at a temperature above room temperature. Generally, when ion texturing surface 17, layer 16 is a temperature below the crystallization temperature of the material from which layer 16 is formed (e.g., a temperature below but near the crystallization temperature of the material from which layer 16 is formed). In some embodiments, when ion texturing surface 17, layer 16 is at a temperature below the temperature at which the material from which layer 16 is formed will undergo crystallization without the assistance of the ions. In certain embodiments, the temperature of layer 16 during ion texturing of surface 17 can be up to about one third the melting point of the material from which layer 16 is formed. In embodiments in which layer 16 is formed of YSZ, ceria or MgO, the temperature of layer 16 during ion texturing of surface 17 can be up to, for example, about 900° C.

Generally, surface 17 is exposed to the ion beams for a period of time sufficient to result in surface 17 having the desired texture (e.g., the desired in-plane and out-of-plane alignment). In some embodiments, ion texturing is performed for at least about 10 seconds (e.g., at least about one minute, at least about five minutes, at least about 10 minutes, at least about 30 minutes, from about one minute to about 10 minutes, from about three minutes to about seven minutes, from about four minutes to about six minutes).

In certain embodiments, after surface 17 has been textured (or at least partially textured) by ion beams 26 and 28, the temperature of layer 16 can be decreased (e.g., to about room temperature) while continuing to expose surface 17 to ion beams 26 and/or 28 (e.g., with or without changing the ion flux of beams 26 and/or 28). It is believed that this can assist in maintaining the desired texture of surface 17 (e.g., the in-plane and out-of-plane alignment of surface 17) while the temperature of layer 16 is decreased (e.g., to about room temperature).

Typically, ion texturing is performed in an environment of reduced total pressure (e.g., a pressure less than about 10 milliTorr, less than about one milliTorr, from about 0.1 milliTorr to about one milliTorr, from about 0.5 milliTorr to about one milliTorr).

Generally, surface 17 can be exposed to the ion beams in any environment that allows for the desired texturing of surface 17 (e.g., the desired in-plane and out-of-plane alignment). In certain embodiments, the environment includes one or more inert gases (e.g., He, Ne, Ar, Kr and/or Xe) and/or one or more types of neutral particles. In some embodiments, one or more of the ion beams contain one or more reactive species (e.g., oxygen and/or nitrogen). In certain embodiments, one or more of the ion beams include one or more inert gases and/or types of neutral particle, and one or more reactive species (e.g., an inert gas and a reactive species; a neutral particle and a reactive species. The ratio of the reactive specie(s) (e.g., oxygen) to inert gas(es) is at least about 1:1 (e.g., at least about 1:10, at least about 1:20).

The ions impinging on surface 17 should have sufficient energy to result in surface 17 having the desired texture (e.g., the desired in-plane and out-of-plane alignment). In certain embodiments, the energy of the ions is low enough to avoid undesired sputtering of the material from which layer 16 is formed. The ions typically have an energy of at least about 10 eV (e.g., at least about 100 eV, at least about 200 eV, at least about 300 eV, at most about 500 eV) and at most about 1,000 eV (e.g., at most about 900 eV, at most about 800 eV, at most about 700 eV, at most about 600 eV).

The flux of ions at surface 17 should be sufficient to result in surface 17 having the desired texture (e.g., the desired in-plane and out-of-plane alignment). In some embodiments, because the material from which layer 16 is formed is not being simultaneously deposited during ion bombardment, the flux of ions at surface 17 during ion texturing can be substantially higher than the flux of ions typically used during ion beam assisted deposition. For example, the flux of ions can be at least about 10 microAmperes per square centimeter (e.g., at least about 50 microAmperes per square centimeter, at least about 100 microAmperes per square centimeter, at least about 200 microAmperes per square centimer, at least about 300 microAmperes per square centimeter, at least about 400 microAmperes per square centimeter, at least about 500 microAmperes per square centimeter, at least about 600 microAmperes per square centimeter, at least about 700 microAmperes per square centimeter, at least about 800 microAmperes per square centimeter, at least about 900 microAmperes per square centimeter, at least about 1,000 microAmperes per square centimeter).

In some embodiments, the ion texturing method textures the surface of layer 16 to a depth of less than about 50 nanometers (e.g., less than about 25 nanometers, less than about 20 nanometer). In certain embodiments, the ion texturing method textures layer 16 to a depth of at least about five nanometers (e.g., at least about 10 nanometers, at least about 15 nanometers).

Ion textured surface 17 typically can have a full width at half maximum (FWHM) X-ray phi scan value of less than about 20° (e.g., less than about 15°, less than about 10°, less than about 5°).

In some embodiments, ion textured surface 17 has a root mean square roughness of less than about 100 angstroms (e.g., less than about 50 angstroms, less than about 25 angstroms) as determined using atomic force microscopy or profilometry.

Noncrystalline layer 16 can be prepared using any of the standard methods for forming a noncrystalline layer. Such methods include, for example, chemical vapor deposition, physical vapor deposition, metalorganic deposition, or magnetron sputtering.

In some embodiments, noncrystalline layer 16 can be prepared relatively quickly (e.g., greater than about one nanometer per second, greater than about five nanometers per second, greater than about 10 nanometers per second).

In certain embodiments, layer 16 has a thickness of greater than about 20 nanometers (e.g., greater than about 50 nanometers, greater than about 100 nanometers, greater than about 500 nanometers, greater than about 750 nanometers). In some embodiments, layer 16 is less than about 1000 nanometers thick (e.g., less than about 800 nanometers thick, less than about 600 nanometers thick, less than about 400 nanometers thick).

Layer 16 can be formed of any material appropriate for use in article 10 (e.g., a buffer layer for a superconductor article). Such materials include, for example, metals, and metal oxides, such as silver, nickel, $TbO_x$, $GaO_x$, ceria, YSZ, $Y_2O_3$, $LaAlO_3$, $SrTiO_3$, $Gd_2O_3$, $LaNiO_3$, $LaCuO_3$, $SrRuO_3$, $NdGaO_3$, $NdAlO_3$ and/or nitrides as known to those skilled in the art.

Layer 12 can be formed of any material capable of supporting layer 16. In embodiments in which article 10 is a multi-layer superconductor, layer 12 can be formed of a substrate material, such as a metal or alloy. In certain embodiments, layer 12 is formed of a mechanically strong, flexible material that is suitable for its intended application (e.g., suitable for use in an extended length coated superconductor in the shape of a tape).

Generally, layer 12 is not textured. Typically, layer 12 is polycrystalline or noncrystalline. In some embodiments in which layer 12 is polycrystalline or noncrystalline, surface 17 and/or surface 15 can be textured (e.g., biaxially textured or cube textured).

In some embodiments, layer 12 is formed of a metal or alloy having a coefficient of thermal expansion that is about the same as the coefficient of thermal expansion of the material of layers 14 and/or 16. In certain embodiments, layer 12 is formed of a material that is relatively stable against oxidation under the processing conditions to which it is exposed. An example of a material from which layer 12 can be formed is an alloy of Ni, Cr and Mo. The Cr can be used, for example, to form an oxide scale which is stabilized against both oxygen and cation diffusion by the addition of Mo. The oxide scale can be thin, self-healing and/or provide good protection of layer 14 from the diffusion of constituents of layer 12 (this can allow layer 16 to be relatively thin, such as, for example, less than about 250 nanometers thick). In alternate embodiments, layer 12 can be formed of a metal oxide, such as YSZ.

In certain embodiments in which layer 12 is noncrystalline, surface 13 can be ion textured (e.g., when layer 12 is formed of YSZ, such as noncrystalline YSZ formed by, for example, tape casting and sintering). In these embodiments, layer 16 need not be present.

Other examples of materials (e.g., metals or alloys) that can be used for layer 12 are known to those skilled in the art and are contemplated as being within the scope of the invention.

Layer 14 can be formed of a superconductor material. Examples of superconductor materials include rare earth-barium-copper-oxides (REBCO), such as YBCO (e.g., $YBa_2Cu_3O_{7-x}$), bismuth-strontium-calcium-copper-oxides, thallium, and/or mercury based superconductors. A layer of superconductor material can be formed, for example, by pulsed laser deposition, chemical vapor deposition, physical vapor deposition, thermal evaporation, electron beam processes (e.g., using $BaF_2$), direct electron beam growth, slurry processes, chemical methods, liquid phase epitaxy and/or spray pyrolysis.

In certain embodiments, a layer of superconductor material is prepared by disposing a superconductor precursor (e.g., a superconductor precursor solution) on ion textured surface 17 and subsequently processing the precursor to provide the superconductor material. Examples of such precursors include acids, such as acetic acids, including halogenated (e.g., fluorinated and/or chlorinated) acetic acids, including perhaloacetic acids (e.g., perfluoroacetic acid, perchloroacetic acid). Superconductor precursors and methods of processing such precursors to provide superconductor materials are known to those skilled in the art and are contemplated as being within the scope of the invention.

In certain embodiments, layer 14 has a relatively high critical current density (e.g., at least about $5 \times 10^5$ Amperes per square centimeter, at least about $1 \times 10^6$ Amperes per square centimeter, and at least about $2 \times 10^6$ Amperes per square centimeter) as determined by transport measurement at 77K in self field (i.e., no applied field) using a 1 microVolt per centimeter criterion.

In some embodiments, layer 14 is well-ordered (e.g., biaxially textured in plane, or c-axis out of plane and biaxially textured in plane).

The thickness of layer 14 can vary depending upon the intended purpose of article 10. In some embodiments, layer 14 preferably has a thickness of from about 1 micron to about 10 microns (e.g., from about 3 microns to about 8 microns, such as from about 4 microns to about 6 microns).

Figure 5:
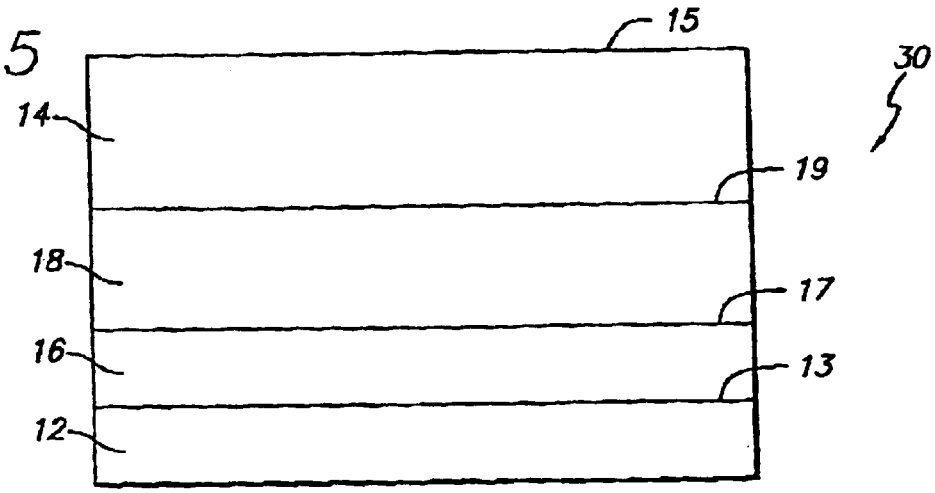
FIG. 5 is a cross-sectional view of an embodiment of a multi-layer article.

FIG. 5 shows an embodiment of an article 30 having layers 12, 14, 16 and 18. In article 30, surface 17 can be ion textured or non-ion textured. Layer 18 is disposed on surface 17 of layer 16, and layer 14 is disposed on ion textured surface 19 of layer 18.

In article 30, layer 18 can be formed of a material that is chemically compatible with the material of layer 14 or a precursor thereof. A material that is chemically compatible with the material of layer 14 or a precursor thereof is a material on which layer 14 can be formed without substantially changing the chemical and/or physical properties of the chemically compatible material. For example, in certain embodiments, such as when layer 14 is formed of a rare earth barium copper oxide (e.g., YBCO), layer 14 may be formed on layer 18 by a process that includes using a precursor that contains one or more halide-containing species (e.g., one or more fluoridic and/or chlorodic species, such as $BaF_2$). In these embodiments, layer 18 should be formed of a material that is chemically compatible with layer 14 under the conditions used to process the precursor to form layer 14. In some embodiments, layer 18 is formed of ceria, $LaAlO_3$, or $SrTiO_3$.

In certain embodiments, surface 19 is textured (e.g., biaxially textured or cube textured) so that layer 14 can be epitaxially formed on surface 19. In some embodiments, surface 19 is ion textured.

In article 30, layer 16 can be thicker than layer 18. For example, layer 16 can have a thickness of at least about 0.1 microns (e.g., at least about 0.3 microns, from about 0.3 microns to about 0.7 microns, from about 0.4 microns to about 0.6 microns, about 0.5 microns). Layer 18 can be less than about 100 nanometers thick (e.g., less than about 50 nanometers thick, from about five nanometers to about 100 nanometers thick, from about 10 nanometers to about 75 nanometers thick, from about 20 nanometers to about 50 nanometers thick).

While certain structures of multi-layer articles (e.g., multi-layer superconductor articles) have been disclosed, other structure are also contemplated. For example, the number of layers (e.g., three layers, four layers, five layers, six layers, seven layers, etc.) disposed between a substrate and a layer of superconductor material can vary as desired. The surfaces of one or more of these layers can be ion textured. The chemical composition of these layers can be the same or different.

Figure 6:
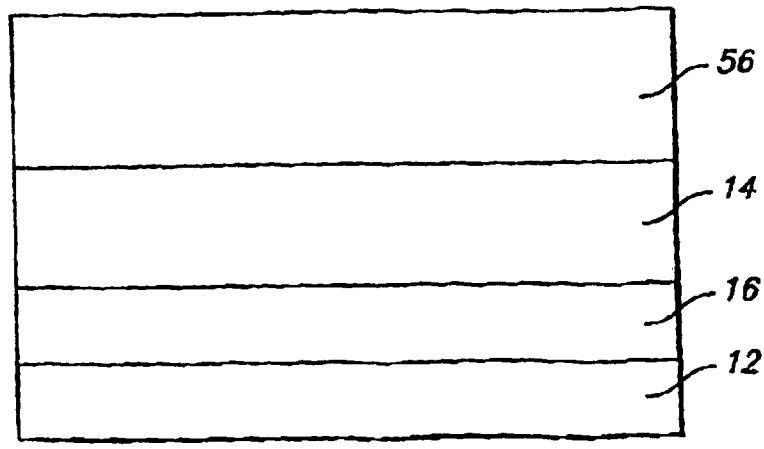
FIG. 6 is a cross-sectional view of an embodiment of a multi-layer article.

Superconductor articles according to the invention can also include a layer of a cap material disposed thereon. FIG. 6 shows an embodiment of such an article 60 having layers 12, 14, 16 and a cap layer 56. Cap layer 56 can be formed of a material (e.g., a metal or alloy) whose reaction products with the superconductor material (e.g., $YBa_2Cu_3O_{7-x}$) are thermodynamically unstable under the reaction conditions used to form the layer of cap material. Exemplary cap materials include silver, gold, palladium and platinum.

While the foregoing discussion has described multi-layer articles having certain structures, the invention is not limited in this sense. Examples of other structures are known to those skilled in the art and contemplated as being within the scope of the invention. Moreover, while methods mentioned above have referred to the use of ions, other particles can also be used (e.g., neutrons, neutral atoms and/or neutral molecules). Furthermore, in embodiments in which multiple intermediate material layers are present between the substrate and the layer of superconductor material, the intermediate layers can provide different desirable properties (e.g., one or more intermediate layers provide good resistance to diffusion of chemical species from the substrate to the layer of superconductor material; one or more intermediate layers are readily textured via ion texturing; one or more layers are chemically compatible with the superconductor material and/or precursors thereof). In some embodiments, this can be achieved by disposing the multiple intermediate layers in sequence.

The following examples are illustrative only and not intended to be limiting.

EXAMPLE I

A (001)<100>YSZ surface is formed using two ion beams as follows.

Each of two ion beams is provided at an angle of about 55° to the perpendicular of a noncrystalline YSZ surface. The two ion beams are about 110° apart. Each ion gun is from about three to about five centimeters from the YSZ surface. This corresponds to the arrangement shown in FIGS. 2A and 2B where $\alpha$ is about 110° and $\theta$ is about 55°.

The surface of the noncrystalline YSZ material is heated to a temperature of from about 700° C. to about 800° C. after which the two ion guns are activated so that the surface of the noncrystalline YSZ material is simultaneously exposed to ions from the ion guns. The ion guns are operated at 300 eV each with a beam current of from about 10 microAmperes per square centimeter to about 100 microAmperes per square centimeter. Ion texturing is performed for a time period of from about 30 seconds to about 90 seconds. This results in a (001)<100>YSZ textured layer of about 20 nanometers in thickness and having a FWHM X-ray phi scan value of less than about 10°.

EXAMPLE II

A (001)<100>YSZ surface is formed using two ion beams as follows.

The process of Example I is followed except that the two ion beams are about 70.5° apart. This corresponds to the arrangement shown in FIGS. 2A and 2B where $\alpha$ is about 70.5° and $\theta$ is about 55° for both ion beams.

EXAMPLE III

A (001)<100>YSZ surface is formed using three ion beams as follows.

The process of Example I is followed except that a third ion gun is provided at an angle of about 70.5° relative to each of the other two ion guns. This corresponds to the arrangement shown in FIGS. 3A and 3B where $\alpha$ is about 70.5°, $\alpha'$ is about 70.5° and $\theta$ is about 55°.

EXAMPLE IV

A (001)<100>YSZ surface is formed using four ion beams as follows.

The process of Example I is followed except that four ion guns are provided. Each ion gun is about 70.5° apart from each of the two adjacent ion guns. The first two ion guns are about 110° apart, and the third and fourth ion guns are about 110° apart. This corresponds to the arrangement shown in FIGS. 4A 4B where $\alpha$ is about 70.5°, $\alpha'$ is 70.5°, and $\theta$ is about 55°.

EXAMPLE V

A (001)<100>YSZ surface is formed using two ion beams as follows.

The process of Example I is followed except that the ion guns are not active simultaneously. Instead, the ion guns are used in series. Each ion gun is activated for a finite period of time.

EXAMPLE VI

A (001)<100>YSZ surface is formed using two ion beams as follows.

The process of Example II is followed except that the ion guns are not active simultaneously. Instead, the ion guns are used in series. Each ion gun is activated for a finite period of time.

EXAMPLE VII

A (001)<100>YSZ surface is formed using three ion beams as follows.

The process of Example III is followed except that the ion guns are not active simultaneously. Instead, the ion guns are used in series. Each ion gun is activated for a finite period of time.

EXAMPLE VIII

A (001)<100>YSZ surface is formed using four ion beams as follows.

The process of Example IV is followed except that the ion guns are not active simultaneously. Instead, the ion guns are used in series. Each ion gun is activated for a finite period of time.

EXAMPLE IX

A (001)<100>ceria surface is formed using two ion beams as follows.

Each of two ion beams is provided at an angle of about 45° to the perpendicular of a noncrystalline ceria surface. The two guns are about 90° apart. This corresponds to the arrangement shown in FIGS. 2A and 2B where a is about 90° and $\theta$ is about 45°. The surface of the noncrystalline ceria material is heated to a temperature of from about 700° C. to about 800° C. after which the two ion guns are activated so that the surface of the noncrystalline ceria material is simultaneously exposed to ions from the ion guns. The ion guns are operated at 300 eV each with a beam current of from about 10 microAmperes per square centimeter to about 100 microAmperes per square centimeter. Ion texturing is performed for a time period of from about 30 seconds to about 90 seconds. This results in a (001)<100>ceria textured layer of about 20 nanometers in thickness and having a FWHM X-ray phi scan value of less than about 10°.

EXAMPLE X

A (001)<100>MgO surface is formed using two ion beams as follows.

Each of two ion beams is provided at an angle of about 45° to the perpendicular of a noncrystalline MgO surface. The two guns are about 90° apart. This corresponds to the arrangement shown in FIGS. 2A and 2B where $\alpha$ is about 90° and $\theta$ is about 45°. The surface of the noncrystalline MgO material is heated to a temperature of from about 700° C. to about 800° C. after which the two ion guns are activated so that the surface of the noncrystalline MgO material is simultaneously exposed to ions from the ion guns. The ion guns are operated at 300 eV each with a beam current of from about 10 microAmperes per square centimeter to about 100 microAmperes per square centimeter. Ion texturing is performed for a time period of from about 30 seconds to about 90 seconds. This results in a (001)<100>MgO textured layer of about 20 nanometers in thickness and having a FWHM X-ray phi scan value of less than about 10°.

EXAMPLE XI

A (011)<100>YSZ surface is formed using two ion beams as follows.

The process of Example II is followed except that the first ion beam is at an angle of about 35° relative to the perpendicular of the noncrystalline YSZ surface and the second ion beam is at an angle of about 35° relative to the YSZ surface. The two guns are at an angle of about 70.5° relative to each other. This corresponds to the arrangement shown in FIGS. 2A and 2B where $\alpha$ is about 110°, $\theta_1$ is about 35° and $\theta_2$ is about 35°.

It is to be understood that in any of the foregoing examples, layers can be deposited onto the ion textured surface. Such layers include, for example, a protective layer (e.g., a layer of material that is chemically compatible with a superconductor material or a precursor thereof, such as ceria, LaAlO$_3$ or SrTiO$_3$) or a layer of a superconductor material or a precursor thereof (e.g., a layer of a rare earth barium copper oxide, such as YBCO, or a precursor thereof, such as a halide-containing precursor).

While certain embodiments have been described, the invention is not limited to these embodiments. Other embodiments are in the claims.

What is claimed is:

1. A method of ion texturing a noncrystalline surface of a layer of a cubic structure material, the method comprising:
    exposing the noncrystalline surface to at least two ion beams to texture the noncrystalline surface and form a biaxially textured surface of the cubic structure material,
    wherein the at least two ion beams impinge on the noncrystalline surface in sequence, and
    wherein the at least two ion beams impinge on the surface of the noncrystalline layer at a first angle relative to a perpendicular to the noncrystalline surface, the at least two ion beams being disposed relative to each other at a second angle around the perpendicular to the noncrystalline surface so that a crystal plane of the biaxially textured surface is oriented perpendicular to the biaxially textured surface.

2. The method of claim 1, wherein the cubic structure material comprises YSZ and the first angle is from about 51° to about 59°.

3. The method of claim 2, wherein the first angle is about 55°.

4. The method of claim 1, wherein the cubic structure material comprises YSZ and the YSZ is at a temperature of from about room temperature to about 900° C. during ion texturing.

5. The method of claim 4, wherein the first angle is about 55°.

6. The method of claim 1, wherein the cubic structure material comprises a material selected from the group consisting of rock salt structure materials and fluorite structure materials.

7. The method of claim 1, wherein the cubic structure material comprises a material selected from the group consisting of MgO, TiN, CaO, SrO, ZrO, BaO, YSZ and ceria.

8. The method of claim 1, wherein the second angle is about 180°.

9. The method of claim 1, wherein the second angle is about 90°.

10. The method of claim 1, further comprising disposing a layer of a second material on the biaxially textured surface of the cubic structure material, the second material being selected from the group consisting of superconductor materials, precursors of superconductor materials, materials that are chemically compatible with superconductor materials, and materials that are chemically compatible with precursors of superconductor materials.

11. The method of claim 10, wherein the second material is chemically compatible with BaF$_2$.

12. The method of claim 10, wherein the second material is selected from the group consisting of ceria, LaAlO$_3$ and SrTiO$_3$.

13. The method of claim 10, wherein the second material is selected from the group consisting of YBCO and precursors of YBCO.

14. The method of claim 1, wherein biaxially textured surface of the cubic structure material is cube textured.

15. The method of claim 1, further comprising, before exposing the noncrystalline surface to the at least two ion beams, forming the layer of the cubic structure material having the noncrystalline surface by simultaneously depositing the cubic material and exposing the cubic material to at least one ion beam.

16. The method of claim 1, further comprising, after forming the biaxially textured surface, simultaneously depositing more of the cubic material on the biaxially textured surface and exposing the cubic material to at least one ion beam.

17. The method of claim 1, further comprising at least a third ion beam wherein at least two ion beams simultaneously impinge on the noncrystalline surface.

18. The method of claim 1, wherein the at least two ion beams are two ion beams.

19. The method of claim 1, wherein the at least two ion beams are three ion beams.

20. The method of claim 19, wherein one of the three ion beams impinges on the noncrystalline surface simultaneously with another ion beam.

21. The method of claim 1, wherein the at least two ion beams are four ion beams.

22. The method of claim 21, wherein at least one of the four ion beams impinges on the noncrystalline surface simultaneously with at least one other ion beam.

23. The method of claim 21, wherein at least two of the four ion beams impinge on the noncrystalline surface simultaneously with at least two other beams.

24. A method as recited in claim 1, wherein at least two ion beams impinge sequentially and at least two ion beams impinge simultaneously.

25. A method of ion texturing a noncrystalline surface of a layer of a material, the method comprising:
    exposing the noncrystalline surface to at least two ion beams to texture the noncrystalline surface and form a textured surface of the material,
    wherein the at least two ion beams impinge on the noncrystalline surface in sequence, and
    wherein a first ion beam of the at least two ion beams impinges on the surface at a first angle relative to the perpendicular to the noncrystalline surface, a second ion beam of the at least two ion beams impinges on the surface of the noncrystalline layer at a second angle relative to a perpendicular to the noncrystalline surface, the at least two ion beams being disposed relative to each other at a third angle so that a crystal plane of the biaxially textured surface is oriented perpendicular to the biaxially textured surface.

26. The method of claim 25, wherein the at least two ion beams are two ion beams.

27. The method of claim 25, wherein the at least two ion beams are three ion beams.

28. The method of claim 25, wherein the at least two ion beams are four ion beams.

29. The method of claim 25, wherein the at least two ion beams simultaneously impinge on the noncrystalline surface.

30. The method of claim 25, further comprising, before exposing the noncrystalline surface to the at least two ion beams, forming the layer of the material having the noncrystalline surface by simultaneously depositing the material and exposing the material to at least one ion beam.

31. The method of claim 25, further comprising, after forming the biaxially textured surface, simultaneously depositing more of the material on the textured surface and exposing the material to at least one ion beam.

32. The method of claim 25, further comprising disposing a layer of a second material on the textured surface of the material, the second material being selected from the group consisting of superconductor materials, precursors of superconductor materials, materials that are chemically compatible with superconductor materials, and materials that are chemically compatible with precursors of superconductor materials.

33. The method of claim 32, wherein the second material is chemically compatible with $BaF_2$.

34. The method of claim 32, wherein the second material is selected from the group consisting of ceria, $LaAlO_3$ and $SrTiO_3$.

35. The method of claim 32, wherein the second material is selected from the group consisting of YBCO and precursors of YBCO.

36. The method of claim 32, wherein the material is at an exposure temperature during exposure to the at least two ion beams, the exposure temperature being less than a crystallization temperature of the material.

37. The method of claim 36, wherein the exposure temperature is less than about one third of the crystallization temperature of the material.

38. The method of claim 25, wherein the textured surface is biaxially textured.

39. The method of claim 25, wherein the textured surface is cube textured.

40. The method of claim 25, wherein the material is selected from the group consisting of cubic structure materials and hexagonal structure materials.

41. The method of claim 25, wherein the material is selected from the group consisting of rock salt structure materials and fluorite structure materials.

42. The method of claim 25, wherein an ion flux at the surface of the material is at least about 10 microAmperes per square centimeter.

43. The method of claim 25, wherein the crystal plane is the (001) plane.

44. The method of claim 25, wherein the method textures the material to a depth of less than about 50 nanometers.

45. The method of claim 25, wherein the textured surface has a X-ray phi scan full width at half maximum of less than about 20°.

46. The method of claim 25, wherein the textured surface has a root mean square roughness of less than about 100 angstroms.

47. The method of claim 25, wherein the noncrystalline layer is supported by a substrate.

48. The method of claim 47, wherein the substrate is a nontextured substrate.

49. The method of claim 25, wherein the method is performed in a pressure of less than about 10 millitorr.

50. The method of claim 25, wherein exposure to the ions occurs for a time period of at least about 10 seconds.

51. The method of claim 25, further comprising, after an initial ion exposure, decreasing the temperature while exposing the surface to ions.

52. The method of claim 25, wherein the first angle is different than the second angle.

53. A method as recited in claim 25, wherein at least two ion beams impinge sequentially and at least two ion beams impinge simultaneously.

54. A method, comprising:
   exposing a surface of a noncrystalline layer of a first material to at least two ion beams to texture the noncrystalline surface and to form a textured surface of the first material;
   wherein the at least two ion beams impinge on the noncrystalline surface in sequence, and
   disposing a layer of a second material on the textured surface of the first material, the second material being chemically compatible with a third material selected from the group consisting of superconductors and precursors of superconductors.

55. The method of claim 54, wherein the third material is selected from the group consisting of rare earth metal oxide superconductors and precursors of rare earth metal oxide superconductors.

56. The method of claim 54, wherein the third material is selected from the group consisting of YBCO and precursors of YBCO.

57. The method of claim 54, wherein the third material comprises an acid.

58. The method of claim 54, wherein the third material comprises a halogenated acetic acid.

59. The method of claim 54, wherein the third material comprises trifluoroacetic acid.

60. The method of claim 54, wherein the third material comprises $BaF_2$.

61. The method of claim 54, wherein the method forms a superconductor article having a critical current density of at least about $5 \times 10^5$ Amperes per square centimeter.

62. The method of claim 54, wherein the second material comprises a material selected from the group consisting of ceria, $LaAlO_3$ and $SrTiO_3$.

63. The method of claim 54, wherein the first material is selected from the group consisting of YSZ and nitrides.

64. The method of claim 54, further comprising disposing the third material on a surface of the second material.

65. The method of claim 64, wherein the third material comprises YBCO.

66. The method of claim 64, wherein the third material comprises a precursor of YBCO.

67. A method as recited in claim 54, wherein at least two ion beams impinge sequentially and at least two ion beams impinge simultaneously.

68. A method, comprising:
   disposing a noncrystalline layer of a second material on a surface of a first material, the second material being chemically compatible with a third material selected from the group consisting of superconductors and precursors of superconductors; and
   exposing a surface of the noncrystalline layer of the second material to at least two ion beams to texture the noncrystalline surface and to form a textured surface of the second material;
   wherein the at least two ion beams impinge on the noncrystalline surface in sequence.

69. The method of claim 68, wherein the third material is selected from the group consisting of rare earth metal oxide superconductors and precursors of rare earth metal oxide superconductors.

70. The method of claim 68, wherein the third material is selected from the group consisting of YBCO and precursors of YBCO.

71. The method of claim 68, wherein the third material comprises an acid.

72. The method of claim 68, wherein the third material comprises a halogenated acetic acid.

73. The method of claim 68, wherein the method forms a superconductor article having a critical current density of at least about $5 \times 10^5$ Amperes per square centimeter.

74. The method of claim 68, wherein the layer of the first material is noncrystalline.

75. The method of claim 68, wherein the second material comprises a material selected from the group consisting of ceria, $LaAlO_3$ and $SrTiO_3$.

76. The method of claim 68, wherein the first material is selected from the group consisting of YSZ and nitrides.

77. The method of claim 68, further comprising disposing the third material on a surface of the second material.

78. The method of claim 77, wherein the third material comprises a rare earth metal oxide.

79. The method of claim 77, wherein the third material comprises a precursor of a rare earth metal oxide.

80. A method as recited in claim 68, wherein at least two ion beams impinge sequentially and at least two ion beams impinge simultaneously.

81. A system, comprising:
   a first ion beam source capable of emitting a first ion beam; and
   a second ion beam source capable of emitting a second ion beam,
   wherein the first and second ion beam sources are positioned so that when they emit the first and second ion beams, respectively, to impinge on a surface to texture the surface, the first ion beam is disposed at a first angle relative to a perpendicular to the surface and the second ion beam is disposed at a second angle relative to the perpendicular to the surface, and the first and second ion beams are disposed relative to each other at a third angle so that a crystal plane of the textured surface is oriented perpendicular to the textured surface; and
   wherein said first and second ion beam sources are configured for sequential emission of at least two said ion beams.

82. The system of claim 81, wherein the third angle is about 90°.

83. The system of claim 81, wherein the first angle is different than the second angle.

84. The system of claim 81, further comprising a third ion beam source capable of emitting a third ion beam.

85. The system of claim 84, wherein the third ion beam source is positioned so that when it emits the third ion beam to impinge on the surface to texture the surface, the third ion beam is disposed at a fourth angle relative to the perpendicular to the surface, and the first and third ion beams are disposed relative to each other at a fourth angle so that a crystal plane of the textured surface is oriented perpendicular to the textured surface.

86. The system of claim 85, further comprising a fourth ion beam source capable of emitting a fourth ion beam.

87. The system of claim 86, wherein the fourth ion beam source is positioned so that when it emits the fourth ion beam to impinge on the surface to texture the surface, the fourth ion beam is disposed at a fifth angle relative to the perpendicular to the surface, and the fourth and third ion beams are disposed relative to each other at a sixth angle so that a crystal plane of the textured surface is oriented perpendicular to the textured surface.

88. The system of claim 84, further comprising a fourth ion beam source capable of emitting a fourth ion beam.

89. A system, comprising:
   first ion beam means for emitting a first ion beam; and
   second ion beam means for emitting a second ion beam,
   wherein the first and second ion beam means are positioned so that when they emit the first and second ion beams, respectively, to impinge on a surface to texture the surface, the first ion beam means is disposed at a first angle relative to a perpendicular to the surface and the second ion beam means is disposed at a second angle relative to the perpendicular to the surface, and the first and second ion beams are disposed relative to each other at a third angle around the perpendicular to the surface so that a crystal plane of the textured surface is oriented perpendicular to the textured surface; and
   wherein said first and second ion beam sources are configured for sequential emission of at least two said ion beams.

90. The system of claim 89, wherein the third angle is about 90°.

91. The system of claim 89, wherein the first angle is different than the second angle.

92. The system of claim 89, further comprising third ion beam means capable of emitting a third ion beam.

93. The system of claim 92, wherein the third ion beam means is positioned so that when it emits the third ion beam to impinge on the surface to texture the surface, the third ion beam is disposed at a fourth angle relative to the perpendicular to the surface, and the first and third ion beams are disposed relative to each other at a fourth angle around the perpendicular to the surface so that a crystal plane of the textured surface is oriented perpendicular to the textured surface.

94. The system of claim 93, further comprising fourth ion beam means capable of emitting a fourth ion beam.

95. The system of claim 94, wherein the fourth ion beam means is positioned so that when it emits the fourth ion beam to impinge on the surface to texture the surface, the fourth ion beam is disposed at a fifth angle relative to the perpendicular to the surface, and the fourth and third ion beams are disposed relative to each other at a sixth angle around the perpendicular to the surface so that a crystal plane of the textured surface is oriented perpendicular to the textured surface.

96. The system of claim 92, further comprising a fourth ion beam means capable of emitting a fourth ion beam.

97. A method of ion texturing a noncrystalline surface of a layer of a cubic structure material, the method comprising:
   exposing the noncrystalline surface to at least two ion beams simultaneously to texture the noncrystalline surface and form a biaxially textured surface of the cubic structure material,
   wherein the at least two ion beams impinge on the surface of the noncrystalline layer at a first angle relative to a perpendicular to the noncrystalline surface, the at least two ion beams being disposed relative to each other at a second angle around the perpendicular to the noncrystalline surface so that a crystal plane of the biaxially textured surface is oriented perpendicular to the biaxially textured surface; and
   wherein at least one said step of exposing the noncrystalline surface to said at least two ion beans is not carried out simultaneously with carrying out deposition on said surface.

98. The method of claim 97, wherein the cubic structure material comprises YSZ and the first angle is from about 51° to about 59°.

99. The method of claim 98, wherein the first angle is about 55°.

100. The method of claim 97, wherein the cubic structure material comprises YSZ and the YSZ is at a temperature of from about room temperature to about 900° C. during ion texturing.

101. The method of claim 100, wherein the first angle is about 55°.

102. The method of claim 97, wherein the cubic structure material comprises a material selected from the group consisting of rock salt structure materials and fluorite structure materials.

103. The method of claim 97, wherein the cubic structure material comprises a material selected from the group consisting of MgO, TiN, CaO, SrO, ZrO, BaO, YSZ and ceria.

104. The method of claim 97, wherein the second angle is about 180°.

105. The method of claim 97, wherein the second angle is about 90°.

106. The method of claim 97, further comprising disposing a layer of a second material on the biaxially textured surface of the cubic structure material, the second material being selected from the group consisting of superconductor materials, precursors of superconductor materials, materials that are chemically compatible with superconductor materials, and materials that are chemically compatible with precursors of superconductor materials.

107. The method of claim 106, wherein the second material is chemically compatible with $BaF_2$.

108. The method of claim 106, wherein the second material is selected from the group consisting of ceria, $LaAlO_3$ and $SrTiO_3$.

109. The method of claim 106, wherein the second material is selected from the group consisting of YBCO and precursors of YBCO.

110. The method of claim 97, wherein biaxially textured surface of the cubic structure material is cube textured.

111. The method of claim 97, further comprising, before exposing the noncrystalline surface to the at least two ion beams, forming the layer of the cubic structure material having the noncrystalline surface by simultaneously depositing the cubic material and exposing the cubic material to at least one ion beam.

112. The method of claim 97, further comprising, after forming the biaxially textured surface, simultaneously depositing more of the cubic material on the biaxially textured surface and exposing the cubic material to at least one ion beam.

113. The method of claim 97, wherein the at least two ion beams are two ion beams.

114. The method of claim 97, wherein the at least two ion beams are three ion beams.

115. The method of claim 97, wherein the at least two ion beams are four ion beams.

116. A method of ion texturing a noncrystalline surface of a layer of a material, the method comprising:
    exposing the noncrystalline surface to at least two ion beams simultaneously to texture the noncrystalline surface and form a textured surface of the material,
    wherein a first ion beam of the at least two ion beams impinges on the surface at a first angle relative to the perpendicular to the noncrystalline surface, a second ion beam of the at least two ion beams impinges on the surface of the noncrystalline layer at a second angle relative to a perpendicular to the noncrystalline surface, the at least two ion beams being disposed relative to each other at a third angle so that a crystal plane of the biaxially textured surface is oriented perpendicular to the biaxially textured surface; and
    wherein at least one said step of exposing the noncrystalline surface to said at least two ion beans is not carried out simultaneously with carrying out deposition on said surface.

117. The method of claim 116, wherein the at least two ion beams are two ion beams.

118. The method of claim 116, wherein the at least two ion beams are three ion beams.

119. The method of claim 116, wherein the at least two ion beams are four ion beams.

120. The method of claim 116, wherein the at least two ion beams simultaneously impinge on the noncrystalline surface.

121. The method of claim 116, further comprising, before exposing the noncrystalline surface to the at least two ion beams, forming the layer of the material having the noncrystalline surface by simultaneously depositing the material and exposing the material to at least one ion beam.

122. The method of claim 116, further comprising, after forming the biaxially textured surface, simultaneously depositing more of the material on the textured surface and exposing the material to at least one ion beam.

123. The method of claim 116, further comprising disposing a layer of a second material on the textured surface of the material, the second material being selected from the group consisting of superconductor materials, precursors of superconductor materials, materials that are chemically compatible with superconductor materials, and materials that are chemically compatible with precursors of superconductor materials.

124. The method of claim 123, wherein the second material is chemically compatible with $BaF_2$.

125. The method of claim 123, wherein the second material is selected from the group consisting of ceria, $LaAlO_3$ and $SrTiO_3$.

126. The method of claim 123, wherein the second material is selected from the group consisting of YBCO and precursors of YBCO.

127. The method of claim 123, wherein the material is at an exposure temperature during exposure to the at least two ion beams, the exposure temperature being less than a crystallization temperature of the material.

128. The method of claim 127, wherein the exposure temperature is less than about one third of the crystallization temperature of the material.

129. The method of claim 116, wherein the textured surface is biaxially textured.

130. The method of claim 116, wherein the textured surface is cube textured.

131. The method of claim 116, wherein the material is selected from the group consisting of cubic structure materials and hexagonal structure materials.

132. The method of claim 116, wherein the material is selected from the group consisting of rock salt structure materials and fluorite structure materials.

133. The method of claim 116, wherein an ion flux at the surface of the material is at least about 10 microAmperes per square centimeter.

134. The method of claim 116, wherein the crystal plane is the (001) plane.

135. The method of claim 116, wherein the method textures the material to a depth of less than about 50 nanometers.

136. The method of claim 116, wherein the textured surface has a X-ray phi scan full width at half maximum of less than about 20°.

137. The method of claim 116, wherein the textured surface has a root mean square roughness of less than about 100 angstroms.

138. The method of claim 116, wherein the noncrystalline layer is supported by a substrate.

139. The method of claim 138, wherein the substrate is a nontextured substrate.

140. The method of claim 116, wherein the method is performed in a pressure of less than about 10 millitorr.

141. The method of claim 116, wherein exposure to the ions occurs for a time period of at least about 10 seconds.

142. The method of claim 116, wherein the first angle is different than the second angle.

143. The method of claim 116, further comprising, after an initial ion exposure, decreasing the temperature while exposing the surface to ions.

144. A method, comprising:
exposing a surface of a noncrystalline layer of a first material to at least two ion beams simultaneously to texture the noncrystalline surface and to form a textured surface of the first material;
disposing a layer of a second material on the textured surface of the first material, the second material being chemically compatible with a third material selected from the group consisting of superconductors and precursors of superconductors;
wherein at least one said step of exposing the noncrystalline surface to said at least two ion beans is not carried out simultaneously with carrying out deposition on said surface.

145. The method of claim 144, wherein the third material is selected from the group consisting of rare earth metal oxide superconductors and precursors of rare earth metal oxide superconductors.

146. The method of claim 144, wherein the third material is selected from the group consisting of YBCO and precursors of YBCO.

147. The method of claim 144, wherein the third material comprises an acid.

148. The method of claim 144, wherein the third material comprises a halogenated acetic acid.

149. The method of claim 144, wherein the third material comprises trifluoroacetic acid.

150. The method of claim 144, wherein the third material comprises $BaF_2$.

151. The method of claim 144, wherein the method forms a superconductor article having a critical current density of at least about $5 \times 10^5$ Amperes per square centimeter.

152. The method of claim 144, wherein the second material comprises a material selected from the group consisting of ceria, $LaAlO_3$ and $SrTiO_3$.

153. The method of claim 144, wherein the first material is selected from the group consisting of YSZ and nitrides.

154. The method of claim 144, further comprising disposing the third material on a surface of the second material.

155. The method of claim 144, wherein the third material comprises YBCO.

156. The method of claim 144, wherein the third material comprises a precursor of YBCO.

157. A method, comprising:
disposing a noncrystalline layer of a second material on a surface of a first material, the second material being chemically compatible with a third material selected from the group consisting of superconductors and precursors of superconductors; and
exposing a surface of the noncrystalline layer of the second material to at least two ion beams simultaneously to texture the noncrystalline surface and to form a textured surface of the second material;
wherein at least one said step of exposing the noncrystalline layer of said second material to said at least two ion beans is not carried out simultaneously with carrying out deposition on said second material.

158. The method of claim 157, wherein the third material is selected from the group consisting of rare earth metal oxide superconductors and precursors of rare earth metal oxide superconductors.

159. The method of claim 157, wherein the third material is selected from the group consisting of YBCO and precursors of YBCO.

160. The method of claim 157, wherein the third material comprises an acid.

161. The method of claim 157, wherein the third material comprises a halogenated acetic acid.

162. The method of claim 157, wherein the method forms a superconductor article having a critical current density of at least about $5 \times 10^5$ Amperes per square centimeter.

163. The method of claim 157, wherein the layer of the first material is noncrystalline.

164. The method of claim 157, wherein the second material comprises a material selected from the group consisting of ceria, $LaAlO_3$ and $SrTiO_3$.

165. The method of claim 157, wherein the first material is selected from the group consisting of YSZ and nitrides.

166. The method of claim 157, further comprising disposing the third material on a surface of the second material.

167. The method of claim 166, wherein the third material comprises a rare earth metal oxide.

168. The method of claim 166, wherein the third material comprises a precursor of a rare earth metal oxide.

\* \* \* \* \*